United States Patent
Chou et al.

(10) Patent No.: US 7,160,771 B2
(45) Date of Patent: Jan. 9, 2007

(54) FORMING GATE OXIDES HAVING MULTIPLE THICKNESSES

(75) Inventors: Anthony I-Chih Chou, Beacon, NY (US); Michael Patrick Chudzik, Beacon, NY (US); Toshiharu Furukawa, Essex Junction, VT (US); Oleg Gluschenkov, Poughkeepsie, NY (US); Paul Daniel Kirsch, Fishkill, NY (US); Byoung Hun Lee, Wappingers Falls, NY (US); Katsunori Onishi, Fishkill, NY (US); Heemyoung Park, LaGrangeville, NY (US); Kristen Colleen Scheer, Milton, NY (US); Akihisa Sekiguchi, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/724,483

(22) Filed: Nov. 28, 2003

(65) Prior Publication Data

US 2005/0118764 A1 Jun. 2, 2005

(51) Int. Cl.
*H01L 21/8242* (2006.01)
*H01L 21/336* (2006.01)
*H01L 21/3205* (2006.01)

(52) U.S. Cl. ............. 438/241; 438/253; 438/258; 438/279; 438/286; 438/592

(58) Field of Classification Search ............. None
See application file for complete search history.

(56) References Cited

U.S. PATENT DOCUMENTS

| | | | |
|---|---|---|---|
| 5,535,158 A * | 7/1996 | Yamagata | 365/185.29 |
| 5,607,868 A * | 3/1997 | Chida et al. | 438/258 |
| 5,658,812 A * | 8/1997 | Araki | 438/258 |
| 5,918,133 A | 6/1999 | Gardner | |
| 5,926,708 A | 7/1999 | Martin | |
| 6,009,023 A | 12/1999 | Lu et al. | |
| 6,033,943 A | 3/2000 | Gardner | |
| 6,037,222 A * | 3/2000 | Huang et al. | 438/257 |
| 6,063,670 A | 5/2000 | Lin et al. | |
| 6,074,908 A * | 6/2000 | Huang | 438/241 |
| 6,074,915 A * | 6/2000 | Chen et al. | 438/258 |
| 6,080,682 A | 6/2000 | Ibok | |
| 6,087,225 A * | 7/2000 | Bronner et al. | 438/275 |
| 6,110,842 A | 8/2000 | Okuno et al. | |
| 6,133,164 A | 10/2000 | Kim | |
| 6,140,185 A | 10/2000 | Kimura | |
| 6,171,911 B1 | 1/2001 | Yu | |
| 6,180,456 B1 * | 1/2001 | Lam et al. | 438/258 |
| 6,184,083 B1 * | 2/2001 | Tsunashima et al. | 438/257 |
| 6,200,834 B1 * | 3/2001 | Bronner et al. | 438/142 |
| 6,232,244 B1 | 5/2001 | Ibok | |
| 6,261,972 B1 | 7/2001 | Tews | |
| 6,262,455 B1 | 7/2001 | Lutze | |

(Continued)

*Primary Examiner*—David E. Graybill
(74) *Attorney, Agent, or Firm*—Howard M. Cohn; Rosa Suazo

(57) ABSTRACT

Gate oxides having different thicknesses are formed on a semiconductor substrate by forming a first gate oxide on the top surface of the substrate, forming a sacrificial hard mask over a selected area of the first gate oxide; and then forming a second gate oxide. A first poly layer may be formed on the first gate oxide, under the hard mask. After the hard mask is removed, a second poly layer may be formed over the second gate oxide and over the first poly layer. This enables the use of high-k dielectric materials, and the first gate oxide can be thinner than the second gate oxide.

7 Claims, 5 Drawing Sheets

U.S. PATENT DOCUMENTS

| | | | |
|---|---|---|---|
| 6,281,050 B1 * | 8/2001 | Sakagami | 438/142 |
| 6,297,103 B1 | 10/2001 | Ahn | |
| 6,314,023 B1 * | 11/2001 | Waldo | 365/185.09 |
| 6,339,001 B1 | 1/2002 | Bronner | |
| 6,346,445 B1 * | 2/2002 | Hsu | 438/279 |
| 6,388,294 B1 * | 5/2002 | Radens et al. | 257/368 |
| 6,432,776 B1 * | 8/2002 | Ono | 438/275 |
| 6,465,323 B1 | 10/2002 | Yu | |
| 6,472,740 B1 | 10/2002 | Engel et al. | |
| 6,573,192 B1 | 6/2003 | Lee | |
| 6,579,766 B1 | 6/2003 | Tews et al. | |
| 6,734,113 B1 * | 5/2004 | Cho et al. | 438/763 |
| 6,780,715 B1 * | 8/2004 | Jeong | 438/275 |
| 6,841,824 B1 * | 1/2005 | Shum | 257/324 |
| 2002/0004277 A1 | 1/2002 | Ahn | |
| 2002/0028554 A1 | 3/2002 | Bronner et al. | |
| 2002/0102827 A1 | 8/2002 | Chen | |
| 2002/0127806 A1 | 9/2002 | Chen | |
| 2002/0168850 A1 * | 11/2002 | Kim | 438/637 |
| 2003/0073288 A1 * | 4/2003 | Pham et al. | 438/261 |
| 2003/0109130 A1 | 6/2003 | Huang | |
| 2004/0081715 A1 * | 4/2004 | Schmitz et al. | 424/776 |

* cited by examiner

FIG. 2D
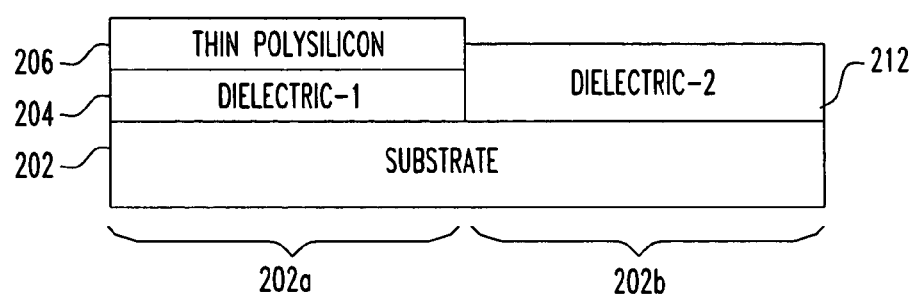
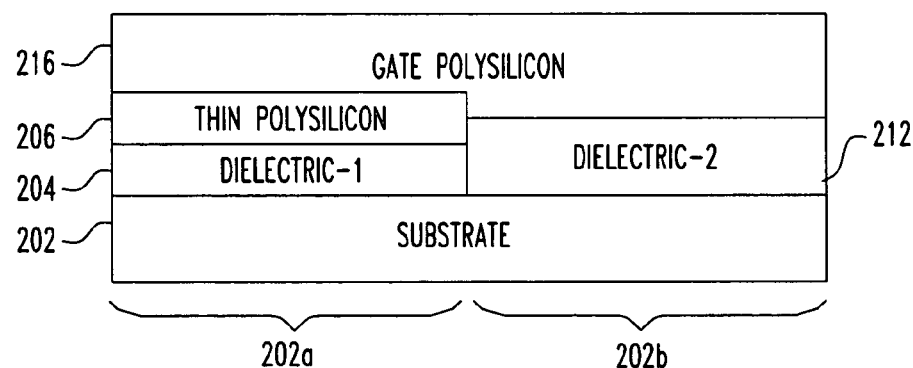
FIG. 2E

FORMING GATE OXIDES HAVING MULTIPLE THICKNESSES

TECHNICAL FIELD OF THE INVENTION

The invention relates to fabrication of gate oxides on semiconductor substrates and, more particularly, to the fabrication of multiple gate oxides having different thicknesses than one another.

BACKGROUND OF THE INVENTION

The scaling of gate dielectrics—also referred to as gate oxides—to smaller thickness is one of the key elements that enables the continued scaling of silicon complementary-metal-on-silicon (CMOS) technology to higher performance levels. Also, having multiple thicknesses for gate oxides (also called gate dielectrics) on a single integrated circuit (IC) chip is desirable to address power and performance concerns as well as input/output (I/O) circuit needs. The thin gate dielectrics are used for the high performance parts of the circuit design, however the thin gate dielectrics also have higher leakage, so they cannot be used on the entire chip. The thicker gate dielectrics are used for lower performance, non-critical devices, which reduces power dissipation by reducing gate leakage. Additionally, these thicker gate dielectric devices are needed to support I/O circuits that require high voltage operation. Thin gate dielectrics are generally unable to meet lifetime requirements at such high voltages.

Thinner gate dielectrics generate more inversion charge, and improve short-channel effects by increasing gate control of the channel. Because the gate dielectric is formed at the interface where the inversion layer is formed and transistor current is conducted, this bottom interface must be extremely high quality. As gate oxide thickness is reduced below 20 Angstroms, even the top interface with the poly (polysilicon; poly-Si) has increasing influence on the conduction in the channel region, so is also important to maintain the quality of the gate oxide/poly-Si interface. The relative importance of this top interface becomes more and more significant as the gate oxide is reduced in thickness.

Typical physical thickness of advanced silicon oxynitride gate dielectric is only 13 Angstroms for 5–7 Si—O bonds. It is known that the top gate dielectric interface (the interface between a gate dielectric and a gate electrode) affect the overall electrical property of such thin dielectrics. For instance, an exposure of the oxynitride surface to water (H2O) undesirably increases the dielectric thickness and replaces nitrogen atoms in the vicinity of the top interface with oxygen atoms undesirably reducing overall dielectric constant of the gate dielectric. In order to preserve such ultra thin gate dielectric, any exposure of gate dielectric to wet chemicals is avoided and the waiting time between processes of forming gate dielectric and depositing gate electrode is minimized. Preferably, the gate electrode is deposited immediately after form gate dielectric without breaking vacuum.

Dielectric materials with dielectric constant (k) higher than that of oxynitride are considered as a replacement to pure oxynitride gate dielectric. HfO2, HfSixOy, HfSixOyNz are the most promising candidates for the advanced high-k based gate dielectric. (The term "high-k" is used to describe a dielectric material featuring a dielectric constant k which is higher than 3.9 which is the k of SiO2.) A typical gate dielectric stack with high-k materials is composed of extremely thin silicon oxide, oxynitride, or nitride followed by a high-k material. It was found that the top surface of a typical high-k material reacts with the gate electrode producing a substantially large fixed electrical charge at the top interface. Electrical properties of the top interface unpredictably vary depending on a chemical state of the top high-k material surface. Subsequently, there is a need of preserving and controlling chemical state of the high-k interface.

U.S. Pat. No. 6,063,670 discloses gate fabrication processes for split-gate transistors. A method for forming an integrated circuit having multiple gate oxide thicknesses is disclosed therein. A circuit (10) is processed up to gate oxide formation. A first gate dielectric (20) is formed. Next, a disposable layer (22) is formed over the first gate dielectric (20). The disposable layer (22) comprises a material that may be removed selectively with respect to silicon and the gate dielectric, such as germanium (Ge). If desired, a second dielectric layer (24) may be formed over the disposable layer (22). A pattern (26) is then formed exposing areas (14) of the circuit where a thinner gate dielectric is desired. The second dielectric layer (24), if it is present, and the disposable layer (22) are removed from the exposed areas. The pattern (26) is then removed. Following pre-gate cleaning, the second gate dielectric (30) is formed. The remaining portions of the disposable layer (22) may be removed either prior to, during, or after the second gate dielectric formation (30).

U.S. Pat. No. 6,140,185 ("Kimura") discloses method of manufacturing semiconductor device. A first gate oxide film is formed on a surface of a silicon substrate. A first polycrystalline silicon film is formed on the first gate oxide film, and patterned so that its side surface is tapered. Silicon oxide film exposed through the first polycrystalline silicon is removed, and a second silicon oxide film having film thickness different from that of the first silicon oxide film is formed by thermal oxidation. Thus, dual gate oxide is manufactured.

FIGS. 14–17, Kimura shows forming a first gate oxide film 1a having a first portion on one side of a field oxide 2 and a second portion on an opposite side of the field oxide. The first portion of the first gate oxide is masked with photoresist (PR). Wet etching removes the second portion of first gate oxide. Then the photoresist is stripped, and thermal oxidation is performed again. This forms a new, second gate oxide in the second portion, and increases the thickness of the remaining first portion of the first gate oxide. Kirnura recognizes that photoresist in contact with the first gate oxide is not desirable, since is contains impurities. Kimura also recognizes that precleaning prior to growing the second gate oxide will also undesirably etch the first gate oxide.

In FIGS. 18–23, Kimura shows farming a first gate oxide film 1a having a first portion on one side of a field oxide and a second portion on an opposite side of the field oxide. A first polycrystalline silicon film doped with an impurity is formed on the entire surface, as a protective film for the first gate oxide film 1a. The first portion of the first gate oxide is masked with photoresist (PR). Then, the polysilicon over the second portion of the gate oxide is etched away. Then the photoresist is stripped, and thermal oxidation is performed again. This forms a new, second gate oxide in the second portion, and forms an oxide coating on the polysilicon over the first portion of the first gate oxide. In this embodiment, the entrance of Na impurities from the photoresist into the first gate oxide is prevented. Therefore, the first gate oxide film 1a is prevented from being rendered conductive, and variation of the threshold voltage of the MOS transistor is prevented.

In FIGS. 1–9, Kimura shows forming a first gate oxide film 1a having a first portion on one side of a field oxide 2 and a second portion on an opposite side of the field oxide. A first polycrystalline silicon film 4a doped with an impurity is formed on the entire surface, as a protective film for the first gate oxide film 1a. The first portion of the first gate oxide is masked with photoresist (PR) 5a. Then, the polysilicon over the second portion of the gate oxide is etched away. Then, the photoresist is stripped, and the first polycrystalline silicon film 4a is patterned and inclined to have an angle (tapered shape). Thereafter, the exposed second portion of the first gate oxide film is removed, and thermal oxidation is performed again. This forms a new, second gate oxide 1b in the second portion, and forms an oxide coating 6 on the polysilicon over the first portion of the first gate oxide. Condition of thermal oxidation is set such that the film thickness of the second gate oxide film 1b differs from the film thickness of the first gate oxide film 1a. Thus, dual gate oxide is formed.

FIGS. 1A–1C illustrate an exemplary prior art technique for forming multiple gate dielectrics (e.g., oxides) on a semiconductor substrate 102. A sequence of steps and structures resulting therefrom are illustrated. For purposes of this discussion, the substrate 102 has a top (as viewed) surface upon which semiconductor devices will be formed, and has two distinct areas (regions)—a left-hand (as viewed) area 102a and a right-hand (as viewed) area 102b. There can be many distinct areas on the semiconductor substrate. The semiconductor substrate 102 is suitably a semiconductor wafer.

First, the entire (both left- and right-hand areas) surface of the substrate 102 is prepared/precleaned, such as with ammonia hydroxide/hydrogen peroxide water mixture (APM, an example of which is "RCA"). Then, a thick dielectric (e.g., thick oxide) 104 is grown or deposited on the entire surface of the substrate 102. The thick dielectric 104 is suitably silicon dioxide ($SiO_2$) or Silicon Oxynitride (SiON), and suitably has a thickness of approximately 2.0–5.5 nm (nanometers)=20–55 Angstroms. The thick dielectric 104 may be grown by thermal oxidation, or it may be deposited by Chemical Vapor Deposition (CVD), Physical Vapor Deposition (PVD), Atomic Layer Deposition (ALD), or the like.

Then, photoresist (PR) 106 is applied and patterned, forming a soft mask for further processing steps, so that a first portion (left-hand side, as viewed) of the thick dielectric 104 is covered with photoresist 106 and a second portion (right-hand side, as viewed) of the thick dielectric 104 is exposed—i.e., it is not covered with photoresist 106. The resulting structure is shown in the cross-sectional view of FIG. 1A.

Next, the thick dielectric 104 is etched away in the exposed (not covered by photoresist) areas (portions), such as with hydrofluoric acid (HF) leaving the right-hand surface area of the substrate 102 exposed. And, the photoresist (soft mask) 106 is removed (stripped).

Then, the substrate is cleaned, again suitably using an RCA wet clean. The cleaning agent should not contain hydrofluoric acid (HF), because this would etch the desired remaining thick dielectric 104. And, a chemical oxide (chemical ox) 108 forms on the exposed (right-hand) area of the substrate 102. The chemical oxide 108 typically has a thickness of approximately 7–12 Angstroms. The resulting structure is shown in the cross-sectional view of FIG. 1B.

Next, a thin dielectric (e.g., thin oxide) 112 is grown or deposited over the entire surface of the substrate—i.e., over the exposed surface of the thick dielectric 104 and over the exposed surface of the chemical oxide 108. This can be done in the presence of a nitrogen plasma (N PLASMA) 110, so that the dielectric is silicon oxynitride (SiON). The thin dielectric (oxide) 112 suitably has a thickness of approximately 10–25 Angstroms. The thin dielectric 112 may be grown by a thermal process, or it may be deposited by a CVD or PVD process.

The resulting structure is shown in the cross-sectional view of FIG. 1C. In the resulting structure, the left-hand side 102a of the substrate 102 has thick dielectric (104+112), and the right-hand side 102b of the substrate 102 has thin dielectric (108+112).

The process described hereinabove can be repeated, multiple times, to achieve more than 2 different oxide thicknesses.

A number of disadvantages and problems are associated with the prior art process described hereinabove.
  the process sequence must be thicker films (e.g., 104) first, then thinner films (e.g., 112);
  the thick dielectric is exposed to the preclean for the thin dielectric;
  the thick dielectric is exposed to thin gate dielectric growth or deposition process, and therefore:
    the tolerance on the thick oxide is degraded (exposed to multiple process); and
    final dielectric properties of thick and thin dielectrics are coupled to each other.
  the thin dielectric area will have chemical oxide prior to growth, and HF cannot be used;
  this sequence is not compatible with high-k integration. (If the high-k is deposited first, it will be exposed to the subsequent oxidation and may degrade as well as contaminate the tool. If the high-k is deposited second, it will be deposited in both areas.)

SUMMARY OF THE INVENTION

An object of the invention is to provide an improved technique for forming gate oxides (gate dielectrics) having multiple (i.e., different) thickness (and, optionally, different composition) on the same semiconductor substrate, without being constrained to first form thicker films, and while preserving the quality of the top gate dielectric surface.

According to the invention, a method of forming different gate oxides on a semiconductor substrate comprises forming a first gate oxide on the top surface of the substrate; depositing a first layer of polysilicon over the first gate oxide; forming a hard mask on top of the first layer of polysilicon; forming a soft mask covering the first gate oxide, first layer of polysilicon and hard mask in the first area of the substrate; removing the hard mask, the first layer of polysilicon and the first gate oxide in the second area of the substrate, leaving the second area exposed; stripping the soft mask; cleaning the exposed second area of the substrate; growing a second gate oxide on the top surface of the substrate in the second area; and removing the hard mask.

According to the invention, a method of forming gate oxides on a semiconductor substrate comprises forming a first gate oxide on the top surface of the substrate; protecting the first gate oxide from damage during subsequent processing steps by forming a sacrificial hard mask over a selected area of the first gate oxide; and then forming a second gate oxide.

According to the invention, a method of forming at least two different gate dielectrics on a substrate comprises forming a first gate dielectric on a surface of the substrate; forming a first gate electrode on the first gate dielectric; forming a sacrificial hard mask on the first gate electrode in the first areas of the substrate; removing the first gate electrode and the first gate dielectric in the second areas of the substrate; cleaning and oxidizing the second areas of the substrate to form a second gate dielectric; removing the sacrificial mask selective to the second gate dielectric; and depositing a second gate electrode electrically connected to the first gate electrode.

According to the invention, an electronic system incorporates at least one IC chip formed by forming a first gate oxide on the top surface of a semiconductor substrate; protecting the first gate oxide from damage during subsequent processing steps by forming a sacrificial hard mask over a selected area of the first gate oxide; and then forming a second gate oxide on the semiconductor substrate.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

FIGS. 2A–2E are cross-sectional views illustrating a sequence of steps in a process for forming multiple gate dielectrics on a semiconductor substrate, according to an embodiment of the invention.

DETAILED DESCRIPTION OF THE INVENTION

Figure 1A:
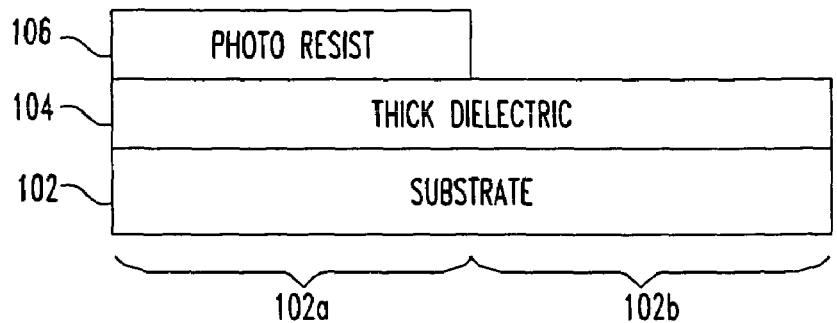
FIGS. 1A–1C are cross-sectional views illustrating a sequence of steps in a process for forming multiple gate dielectrics on a semiconductor substrate, according to the prior art.
Figure 1B:
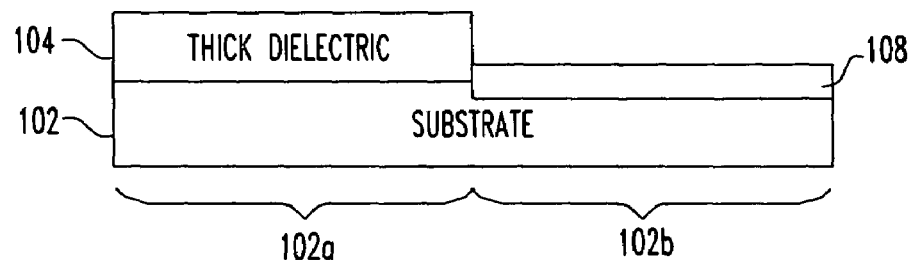
Figure 1C:
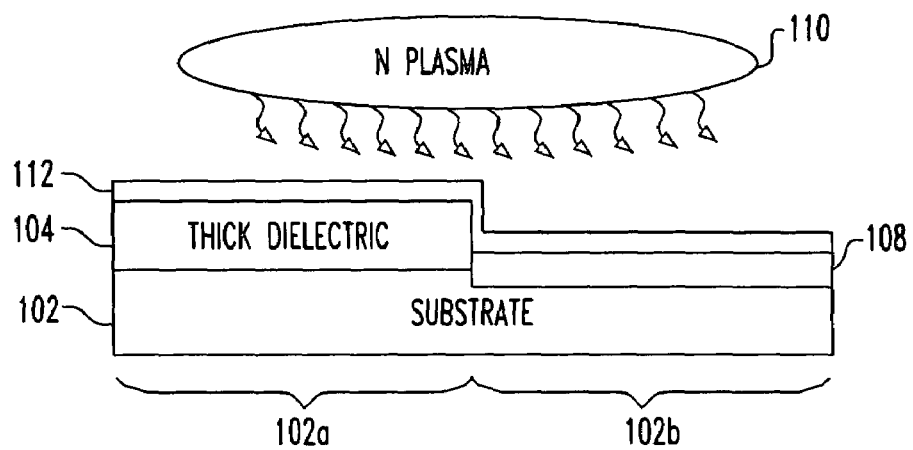

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions are presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

FIGS. 2A–2E illustrate an embodiment of a technique for forming multiple gate dielectrics on a semiconductor substrate 202 (compare 102). A sequence of steps and structures resulting therefrom are illustrated.

For purposes of this discussion, the substrate 202 has a top (as viewed) surface upon which semiconductor devices will be formed, and has two distinct areas—a first (left-hand, as viewed) area 202a and a second (right-hand, as viewed) area 202b which is distinct from the first area. There can be many distinct areas on the semiconductor substrate. The semiconductor substrate 202 is suitably a semiconductor wafer.

First, the entire (both left- and right-hand portions) surface of the substrate 202 is pre-cleaned, such as with RCA. Then, a first gate oxide 204 (DIELECTRIC-1, compare 104) is formed (grown or deposited) on the entire surface of the substrate 102. The first gate oxide 204 is suitably silicon dioxide (SiO2), silicon oxynitride (SiON), silicon nitride (SiN) or high-k, and suitably has a thickness of approximately 5–25 Angstroms, such as 20–25 Angstroms. The first gate oxide 204 may be grown or deposited using known processes.

Then, a thin layer of polysilicon (also "poly-Si", or simply "poly") 206 which will function as a gate electrode is deposited on the entire exposed surface of first gate oxide 204, using known processes. The layer of polysilicon 206 suitably has a thickness of approximately 2–50 nm (20–500 Angstoms).

Then, a hard mask 208 is deposited on the entire exposed surface of the layer of polysilicon 206, using known processes. The hard mask 208 is suitably germanium (Ge), silicon germanium (SiGe), amorphous carbon, SiO2, Si3N4, or other materials that are easy to remove from a silicon wafer without leaving a residue. The hard mask 208 suitably has an initial thickness of approximately 30–50 nm (300–500 Angstroms). As will become evident, the hard mask is sacrificial in that after it serves the purpose of protecting the first gate oxide 204 from subsequent process steps, it can be removed, notably without damaging the subsequently formed second gate oxide (212, described hereinbelow).

Then, photoresist (PR) 210 (compare 106) is applied and patterned, forming a soft mask for further processing steps, so that a first portion (left-hand side, as viewed) of the stack of gate oxide 204/poly-Si 206/hard mask 208 is covered with photoresist 210 and a second portion (right-hand side, as viewed) is exposed—i.e., not covered with photoresist. The photoresist serves as a soft mask. The soft mask 210 covers the first gate dielectric, first layer of polysilicon and hard mask in the first area 202a of the substrate—i.e., a first gate oxide stack. The soft mask 210 leaves exposed the first gate dielectric, first layer of polysilicon and hard mask in the second area 202b of the substrate—i.e., a second gate oxide stack.

Then, the exposed areas of the hard mask 208/poly-Si 206 and DIELECTRIC-1 206 are removed, using standard etching processes such as reactive ion etching (RIE) or wet etching, down to the surface of the substrate 202. The resulting structure is shown in the cross-sectional view of FIG. 2A.

Next, the photoresist 210 is stripped using standard techniques (e.g., mixture of H2SO4 and H2O2). During photoresist strip, the hard mask (Ge) 208' may be partially etched, for example having a thickness of approximately up to 50% less than shown in FIG. 2A. Therefore, the initial thickness of the hard mask 208 must be chosen to ensure that after photoresist strip, a sufficient thickness of hard mask remains. For example, a sufficient remaining thickness would be approximately at least 1.5 nm (15 Angstroms) left after PR strip. The thickness of the hard mask material that remains in place on the substrate after stripping the substrate should be sufficient to be consumed during the second oxidation process (described below) and not allow any poly-Si to be oxidized. Thus, the thickness depends on the second oxide thickness and process conditions.

Figure 2A:
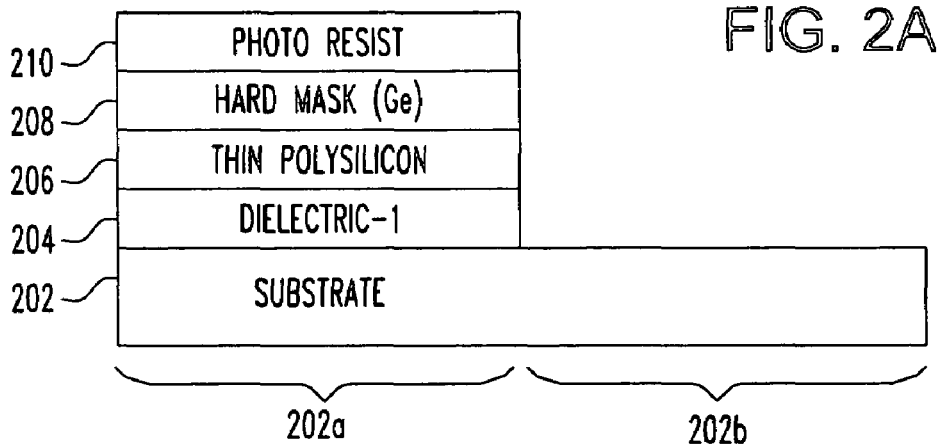
Figure 2B:
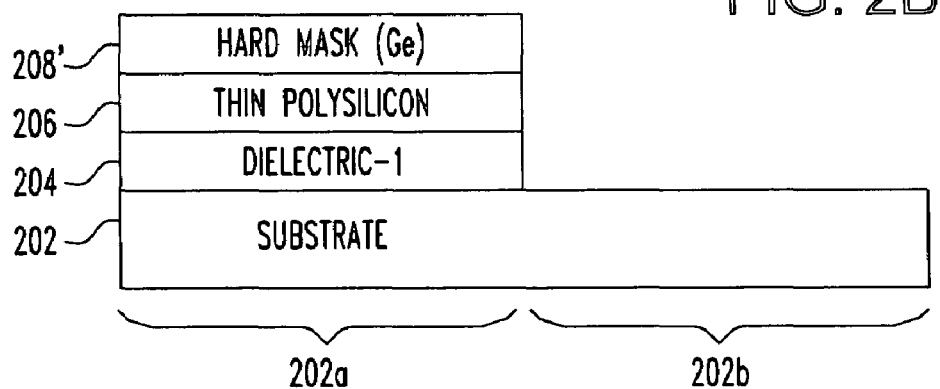
Figure 2C:
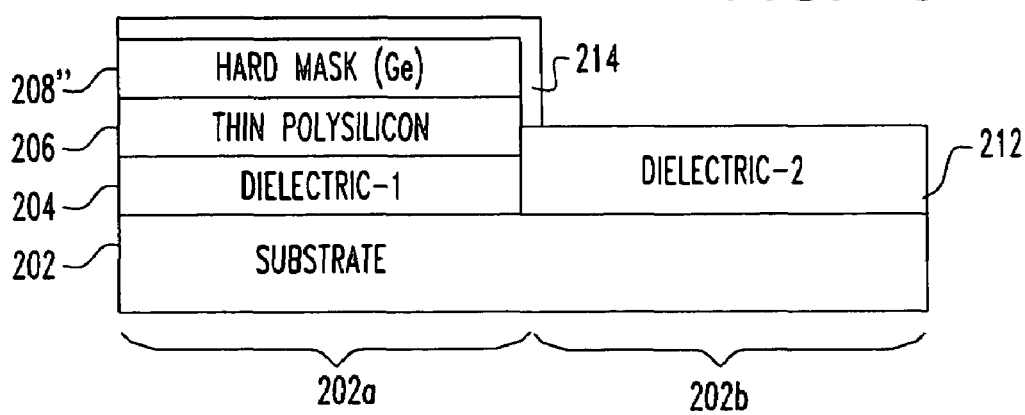
Figure 3A:
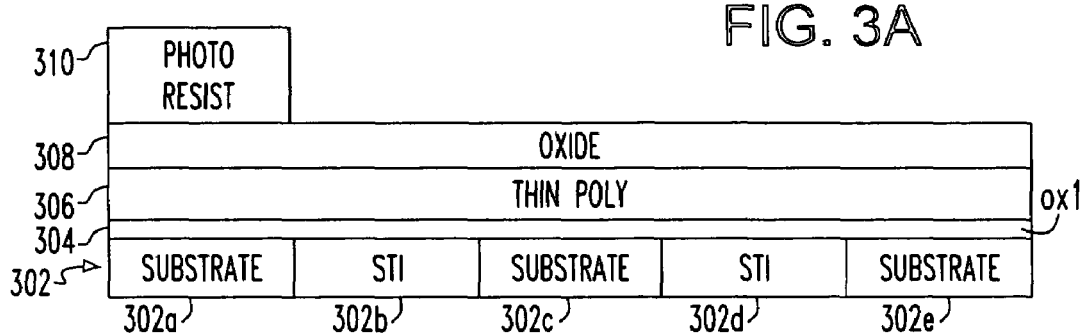
Figure 3B:
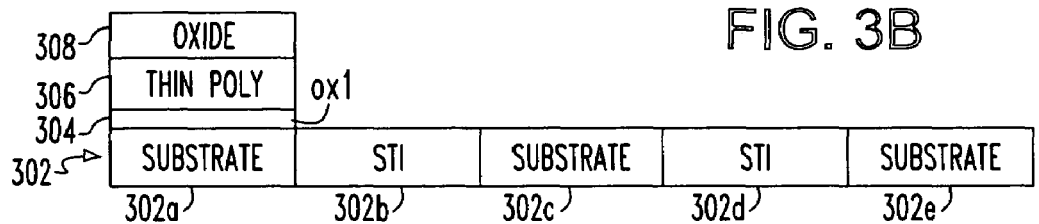
Figure 3C:
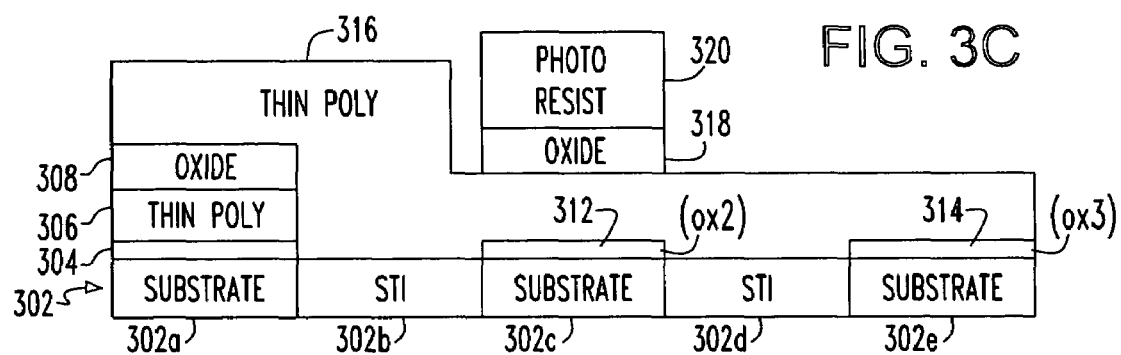
Figure 3D:
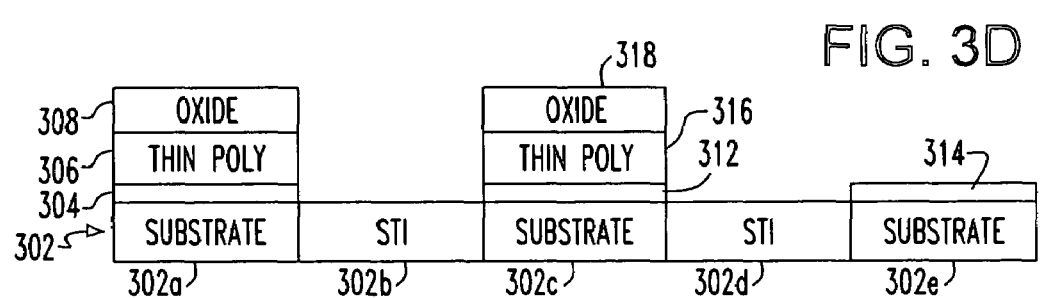
Figure 4:
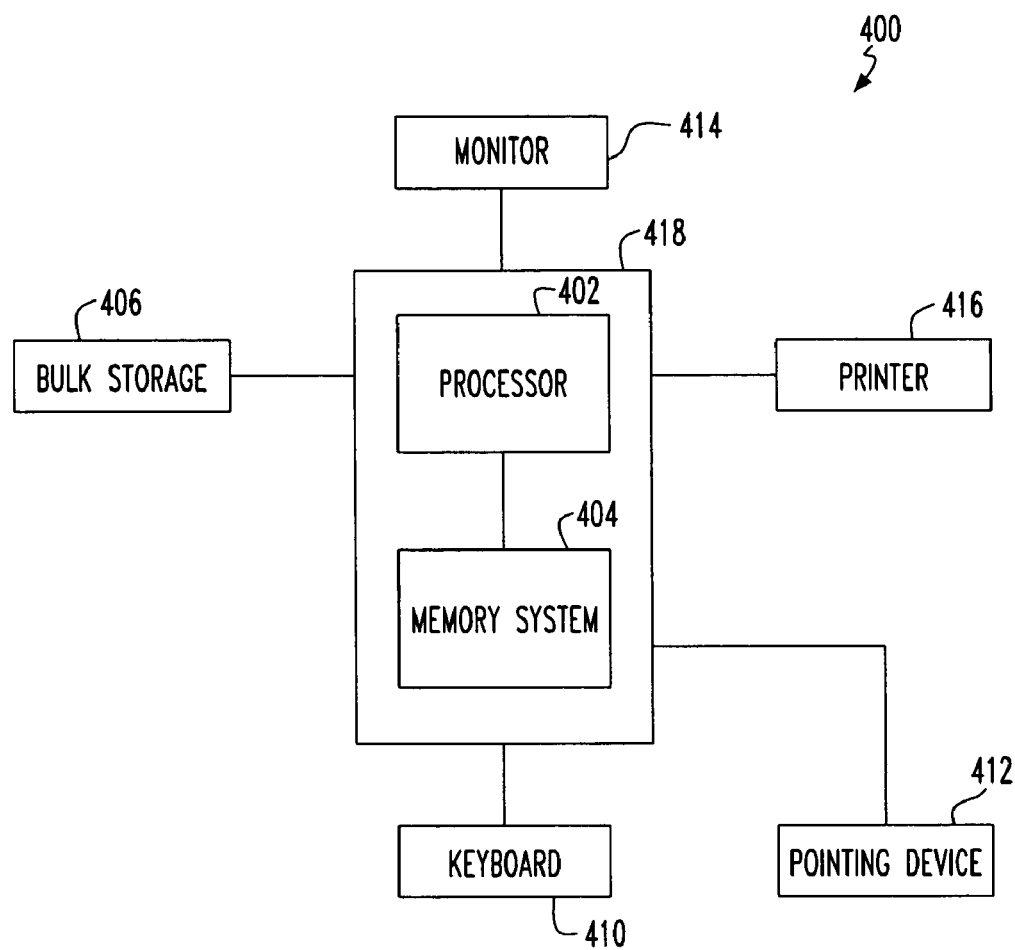

The resulting structure is shown in the cross-sectional view of FIG. 2B wherein the slightly etched hard mask 208' is shown with a primed (') number indicating that it has been altered (in this case, thinned) between the views of FIGS. 2A and 2B.

Next, standard surface preparations are made for forming a second dielectric (DIELECTRIC 2). As is evident, the top of gate oxide 204 is protected from damage during this pre-clean step by the overlying layers of poly-Si 206 and hard mask 208.

Next, a second dielectric (DIELECTRIC-2) 212 is grown. Gate oxide 204 is protected from damage during this step by the overlying layers of poly-Si 206 and hard mask 208. The second dielectric (gate oxide) 210 is suitably silicon dioxide (SiO2), silicon oxynitride (SiON), silicon nitride (SiN) or high-k material, grown by:

rapid thermal oxidation (RTO) in NO, N2O, NH3, O2 (500–1100 degrees C.); or plasma nitridation treatment on base oxide (25–800 degrees C.);

plasma oxidation; UV oxidation; atomic layer deposition.

The second dielectric 212 has an exemplary thickness of approximately 35–40 Angstroms.

During this step, the hard mask (Ge) 208' on top of the DIELECTRIC-1 areas will be oxidized, and a layer of germanium oxide (GeO2) 214 will be formed. The resulting structure is shown in the cross-sectional view of FIG. 2C wherein the slightly oxidized hard mask 208" is shown with a double-primed (") number indicating that it has been altered (in this case, oxidized) between the views of FIGS. 2B and 2C.

It should be noted that the thin poly-Si 206 is also protected from oxidation from the overlying hard mask 208' (208"). It should also be noted that the thickness of the hard mask 208 should be chosen such that it is not entirely consumed by the oxidation process.

Next, the mask oxide (GeO2) 214 is removed using an etch that will remove the GeO2 without affecting (selective to) the second dielectric 212. For example, remove GeO2 with a water rinse since it is water soluble, which will not etch the second dielectric 212. Then, the remaining hard mask (Ge) material 208" is removed, selective to SiO2 and polysilicon. For example, remove the Ge with an H2O2 rinse. The resulting structure is shown in the cross-sectional view of FIG. 2D.

Herein it should be noted that the thin polysilicon 206 has remained in place on top of the first gate oxide 204 throughout the process sequence. Since it is never removed, and remains part of the final structure, the thin polysilicon 206 serves to preserve the high quality of the first gate oxide 204. This enables, among other things, the use of high-k material for the first gate oxide 204.

Next, gate polysilicon 216 (for a second gate electrode) is deposited on top of the entire wafer 202, including the first gate oxide 204 which is already covered by a thin protective layer of polysilicon 206, and including on top of the second dielectric 212. The gate polysilicon 216 may be deposited by a standard process such as low pressure chemical vapor deposition (LPCVD; furnace) or room temperature chemical vapor deposition (RTCVD; single wafer reactor) with SiH4 or other silicon precursor. The temperature for gate polysilicon 216 deposition is suitably approximately 500–800 degrees C., preferably approximately 550–650 degrees C., and the resulting thickness of the polysilicon 216 is suitably approximately 500–2000 Angstroms. Note that because the previously deposited polysilicon layer 206 is thin (typically <50 Angstroms), the planarity of the gate poly stack is maintained, which is beneficial for subsequent process steps such as gate poly lithography (not shown). The resulting structure is shown in the cross-sectional view of FIG. 2E. In the resulting structure, the left-hand side 202a of the substrate 202 has thin gate oxide (204), and the right-hand side 202b of the substrate 202 has thick gate dielectric (212).

Finally, remaining integrated circuit (IC) process steps may proceed in a standard process flow. The process can be performed multiple times to produce more than 2 gate oxide thicknesses. For example, the process described above can be repeated to produce a third gate oxide in a third area of the semiconductor substrate, said third gate oxide having a thickness which is different than either of the first and second gate oxides.

The technique described hereinabove is useful for forming gate oxides of multiple thicknesses, as well as for allowing a thin oxide to be formed before a thicker oxide, and for using high-k materials in gate oxides.

Regarding thicknesses, it is generally contemplated that the thinnest useful gate oxide thickness is approximately 10 Angstroms, and the thickest useful gate oxide thickness is approximately 55 Angstroms. Examples of multiple gate oxide thicknesses would be 12 and 15 Angstroms, or 15 and 30 Angstroms. In any case, the second gate oxide may have a thickness that is significantly different, from a viewpoint of electrical performance (as described above) than that of the first gate oxide, or it may be compositionally different.

The advantages and benefits of the technique described hereinabove include:

"Dielectric-1" (gate oxide) 204 is always covered, therefore:
a high-k dielectric can be used, without danger of cross-contamination
the quality of this dielectric is maintained by avoiding exposure to uncontrolled atmosphere and subsequent process steps. It is known that for high-k, this top interface is the key for achieving desired Vt (threshold voltage) control.
decoupling of multiple gate dielectrics on a single chip;
ability to use HF-based precleans for all gate oxides;
wide gate oxide thickness range for different devices;
reduction of substrate Si loss, which may be important for thin silicon-on-insulator (SOI) and strained Si substrates The first gate oxide 204 can be a high-k material, such as HfO2, HfSixOy, HfSixOyNz, etc. As mentioned, one of the advantages of the present invention is that a high-k material (e.g., for 204), being covered with polysilicon (e.g., 206), can be used in a process for forming multiple gate oxide thicknesses, without danger of cross-contamination. In contrast with a process wherein a high-k first dielectric were not covered by polysilicon, it can be noted that:
when the high-k is covered with polysilicon
the poly protects the high-k/poly interface; and
the poly prevents the high-k from contaminating the process tool or other parts of the same wafer.
when the high-k is not covered with polysilicon
during processing, such as wet process or furnace deposition of polysilicon, the high-K is exposed and can result in contamination of the process tool or other parts of the same wafer.
the exposed surface of high-k may degrade.

In the method described hereinabove, the thin oxide is formed first and then capped with poly. The poly may or may not contain Ge or carbon (C) to control gate activation and boron (B) penetration. The poly is then removed over areas (e.g., 202b) where thick oxide is to be grown. With this method or repetition of this method, multiple oxides can be fabricated with minimal interference with each other.

The benefits of the present invention include:
the thinnest oxide can be grown independently from other oxides;

the surface for the thin oxide growth is the most pristine surface (as opposed to having DG oxide strip and PR removal etch chemical oxide);

option of using HF-base precleans for gate oxides;

thin oxide capping enable easier integration of high-k materials; and silicon consumption is minimized in thin gate region because addition oxidation strip does not cause additional silicon consumption in the thin oxide area (important for strained silicon—loss of strained silicon layer should be minimized as much as possible).

The present invention may be contrasted, for example, with Kimura. The hard mask used in the present invention enables processing the entire structure in a much easier and efficient way in that it is possible to keep the poly height constant for all of the oxide thicknesses. Furthermore, since Kimura uses a non-disposable poly layer as a hard mask, that poly will be exposed to the thermal cycle of the second gate oxide. This may cause undesired grain growth. For the present invention, only the thin poly is exposed to the second thermal cycle—the disposable Ge will be removed anyway and fresh poly will be deposited. Furthermore, Kimura's technique required an additional lithography step formed only on the right side (see FIG. 6). Since the poly in the present invention is relatively thin, an additional lithography step is not necessarily required (see FIG. 2E.). Thus, the inventive technique is not subject to the tolerance associated with two lithography steps. Furthermore, the present invention does not require etching the poly back as in FIG. 6 of Kimura, rather any mask on the poly surface is removed prior to the second oxide deposition and thus there is no reason to etch back. This is a much simpler method. Additionally, for the purpose of incorporating more than two oxides, the thick barrier of the present invention is a better stopping layer than the thin barrier in Kimura's technique.

The soft mask resist process (e.g., Kimura) has the drawback that the soft mask must be removed prior to gate dielectric process. Once it is removed, it cannot block the gate dielectric process from going onto the whole wafer. The result is that the later gate dielectric process will affect previously grown/deposited gate dielectric areas.

In contrast thereto, by using a hard mask which can withstand and block gate dielectric process, the present invention enables selectively placing gate dielectric in the desired areas. This effectively decouples the different gate dielectric processes and areas from each other. This allows for independent optimization of the multiple on-chip dielectrics.

A variety of integrated circuit (IC) chips having circuits formed utilizing the techniques described hereinabove, and such chips can be integrated with other electronic components and subsystems to realize a subsystem or a system having electrical functionality such as, but not limited to memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The invention has been illustrated and described in a manner that should be considered as exemplary rather than restrictive in character—it being understood that all changes and modifications that come within the scope of the invention as set forth in the claims

What is claimed is:

1. Method of forming gate dielectrics on a semiconductor substrate, the substrate having a top surface, a first area and a second area which is distinct from the first area, comprising:

forming a first gate dielectric on the top surface of the substrate;

next depositing a first layer of polysilicon over the first gate dielectric;

next protecting the first gate dielectric from damage during subsequent processing steps by forming a sacrificial hard mask over a selected area of the first layer of polysilicon which is over the first gate dielectric;

next forming a second gate dielectric in the second area;

next removing the sacrificial hard mask; and after removing the sacrificial hard mask, depositing a second layer of polysilicon over the second gate dielectric and over the first layer of polysilicon.

2. A method, according to claim 1, wherein:

the first gate dielectric comprises a material selected from the group consisting of silicon dioxide (SiO2), silicon oxynitride (SiON), silicon nitride (SiN) and high-k material.

3. A method, according to claim 1, wherein:

the second gate dielectric comprises a material selected from the group consisting of silicon dioxide (SiO2), silicon oxynitride (SiON), silicon nitride (SiN) and high-k material.

4. A method, according to claim 1, wherein: the sacrificial hard mask comprises a material selected from the group consisting of germanium (Ge), silicon germanium (SiGe), amorphous carbon, SiO2, Si3N4, and other materials that are easy to remove from a silicon wafer without leaving a residue.

5. A method, according to claim 1, wherein:

the second gate dielectric is formed by a process selected from the group consisting of:

rapid thermal oxidation (RTO) in NO, N2O, NH3, O2 (500–1100 degrees C.);

plasma nitridation treatment on base oxide (25–800 degrees C.); and plasma oxidation; UV oxidation; and atomic layer deposition.

6. A method, according to claim 1, wherein:

the first gate dielectric is thinner than the second gate dielectric.

7. A method, according to claim 1, wherein:

the first gate dielectric comprises a high-k material.

* * * * *